United States Patent [19]

Everett

[11] Patent Number: 4,604,793

[45] Date of Patent: * Aug. 12, 1986

[54] METHOD OF MAKING A CONTROL DEVICE

[75] Inventor: Charles J. Everett, Clinton, Conn.

[73] Assignee: Robertshaw Controls Company, Richmond, Va.

[ * ] Notice: The portion of the term of this patent subsequent to Nov. 20, 2001 has been disclaimed.

[21] Appl. No.: 648,585

[22] Filed: Sep. 10, 1984

Related U.S. Application Data

[62] Division of Ser. No. 527,037, Sep. 29, 1983, Pat. No. 4,484,173.

[51] Int. Cl.[4] .............................................. H01H 11/04
[52] U.S. Cl. .................................................... 29/622
[58] Field of Search ............. 29/622; 338/32 R, 32 H, 338/39, 42; 73/721, 722, 727, 728, DIG. 3; 323/368

[56] References Cited

U.S. PATENT DOCUMENTS 4,289,963  9/1981  Everett ................................. 73/705
4,352,085  9/1982  Herden ................................. 338/42

Primary Examiner—Howard N. Goldberg
Assistant Examiner—P. W. Echols
Attorney, Agent, or Firm—Candor, Candor & Tassone

[57] ABSTRACT

A control device and method of making the same are provided, the control device having a housing provided with an actuator chamber separated from a pressure differential chamber by a wall having an opening therethrough receiving an axially movable actuator pin that transmits axial movement of a movable part in the pressure differential chamber to the actuator chamber. A Hall effect transducer is disposed in the actuator chamber and the actuator pin has a magnet unit for operating the transducer as the movable part axially moves the actuator pin relative to the housing, the magnet unit being disposed in offset relation to the axis of the actuator pin and moving in unison therewith relative to the transducer.

7 Claims, 5 Drawing Figures

METHOD OF MAKING A CONTROL DEVICE

CROSS REFERENCE TO RELATED APPLICATION

This application is a Divisional patent application of its copending parent patent application, Ser. No. 527,037, filed Sept. 26, 1983, now U.S. Pat. No. 4,484,173.

BACKGROUND OF THE INVENTION

1. Field of the Invention

This invention relates to an improved control device of the differential pressure type and to a method of making the same.

2. Prior Art Statement

It is known to provide a control device having a housing means provided with an actuator chamber separated from a pressure differential chamber by wall means having opening means therethrough receiving an axially movable actuator pin that transmits axial movement of a movable part in the pressure differential chamber to the actuator chamber. For example, see the Everett U.S. Pat. No. 4,289,963 wherein an optical switch means is disposed in the actuator chamber of the control device and the actuator pin has an interrupter means for actuating the optical switch means when the movable part moves the actuator pin to a certain position relative to the housing means.

It is also known to cause relative movement between a Hall effect transducer means and a magnet for operating the transducer means through the movement of a wall that has a pressure differential acting across the same. For example, see the Herden U.S. Pat. Nos. 4,254,395, 4,326,419, 4,340,877 and 4,352,085.

It is also known to mount two permanent magnets on spaced apart portions of a bifurcated member so that the Hall effect transducer means is disposed between the magnets, the bifurcated member being movable relative to the fixed transducer. For example, see FIG. 5 of the Honeywell Microswitch Division Publication No. 84-05704-A 980 and FIG. 7 of the aforementioned Herden U.S. Pat. No. 4,352,085.

SUMMARY OF THE INVENTION

It is one feature of this invention to provide a Hall effect transducer means in a control device of the pressure differential type so that the transducer means will be operated by the movement of a movable part of the control device that is disposed in the pressure differential chamber thereof.

For example, it was found according to the teachings of this invention that the magnet means for operating the Hall effect transducer means can be carried by the actuator pin of the control device if the magnet means is disposed in offset relation to the axis of the actuator pin.

In particular, one embodiment of this invention provides a control device having a housing means provided with an actuator chamber separated from a pressure differential chamber by wall means having opening means therethrough receiving an axially movable actuator pin that transmits axial movement of a moveable part in the pressure differential chamber to the actuator chamber. An adjustable range spring is disposed in the actuator chamber and is operatively interconnected to the actuator pin to tend to move the actuator pin in one direction relative to the housing means, the spring having opposed ends. A Hall effect transducer means is disposed in the actuator chamber and the actuator pin has magnet means for operating the transducer means as the movable part axially moves the actuator pin relative to the housing means, the magnet means being disposed in offset relation to the axis of the actuator pin and moving in unison therewith relative to the transducer means. The magnet means comprises an arm having opposed ends and a magnet carried by one of the opposed ends, the other of the opposed ends of the arm being operatively interconnected to the actuator pin. The actuator pin has opposed ends, the other end of the arm being operatively interconnected to one of the opposed ends of the actuator pin. One of the opposed ends of the spring bears against the other end of the arm and holds the other end of the arm against the one end of the actuator pin whereby the magnet moves in unison with the actuator pin.

Accordingly, it is an object of this invention to provide an improved control device having one or more of the novel features of this invention as set forth above or hereinafter shown or described.

Another object of this invention is to provide a method of making such a control device, the method of this invention having one or more of the novel features of this invention as set forth above or hereinafter shown or described.

Other objects, uses and advantages of this invention are apparent from a reading of this description which proceeds with reference to the accompanying drawings forming a part thereof and wherein:

DESRCIPTION OF THE PREFERRED EMBODIMENT

Figure 1:
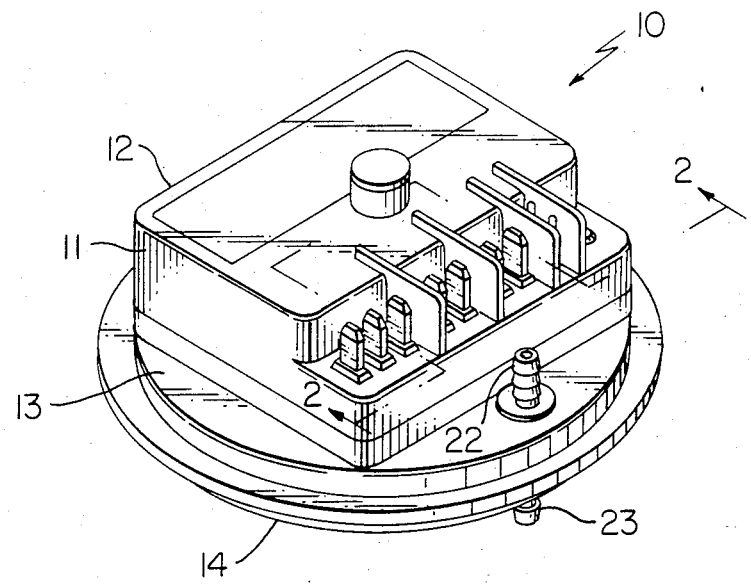
FIG. 1 is a top perspective view of the improved control device of this invention.

While the various features of this invention are hereinafter described and illustrated as being particularly adapted to provide a control device of the pressure differential type for controlling the defrost cycle of a heat pump system, it is to be understood that the various features of this invention can be utilized singly or in any combination thereof to provide a control device for other purposes as desired.

Therefore, this invention is not to be limited to only the embodiment illustrated in the drawings, because the drawings are merely utilized to illustrate one of the wide variety of uses in this invention.

Referring now FIGS. 1-4, the improved control device of this invention is generally indicated by the reference numeral 10 and comprises a housing means 11 formed of three housing parts 12, 13 and 14 shaped in the configuration illustrated in the drawings to cooperate together in forming an actuating chamber 16 on one side of an intermediate wall means 15 and a pressure differential chamber 17 on the other side of the intermediate wall means 15.

While the housing parts 12, 13 and 14 can be formed of any suitable material and can be secured together in any suitable manner, the housing parts 12, 13 and 14 illustrated in the drawings are formed from plastic material and are secured together by adhesive means or by ultrasonic welding in a manner well known in the art.

Figure 4:
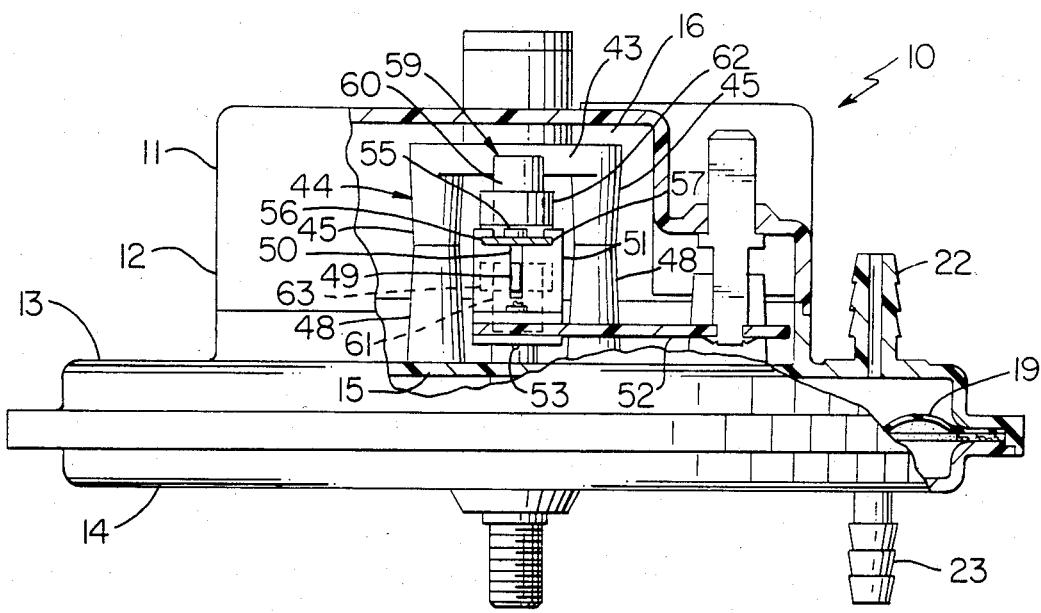
FIG. 4 is a partially broken away cross-sectional view taken on line 4—4 of FIG. 2.

The housing parts 13 and 14 trap an outer peripheral portion 18 of a flexible diaphragm 19 therebetween so that the flexible diaphragm 19 separates the pressure differential chamber 17 into compartments 20 and 21 which are respectively adapted to receive fluid pressure through nipples 22 and 23 formed integrally with the housing parts 13 and 14 as illustrated in FIG. 4 and in a manner well known in the art.

In this manner, changes in the resulting pressure differential acting across the diaphragm 19 causes an intermediate rivet-like part 24 of the diaphragm to move upwardly or downwardly in the chamber 17 to control means in the actuating chamber 16 in a manner hereinafter set forth, the rivet-like member 24 fastening rigid backing plates 25 and 26 to opposite sides 27 and 28 of the flexible diaphragm 19 in a manner conventional in the art.

The intermediate wall 15 of the housing part 13 has a tubular member 29 formed integral therewith and is provided with an opening means 30 that passes completely through the same, the tubular part 29 having a free end 31 disposed in the actuating chamber 16 as illustrated.

An actuating pin 32, also formed of plastic material, if desired, is disposed in the opening means 30 of the tubular part 29 so as to have a free end 33 thereof disposed in the pressure differential chamber 17 to be engaged by the movable part 24 of the diaphragm 19 so as to transmit movement of the diaphragm 19 to the actuating chamber 16 in a manner hereinafter set forth.

Figure 2:
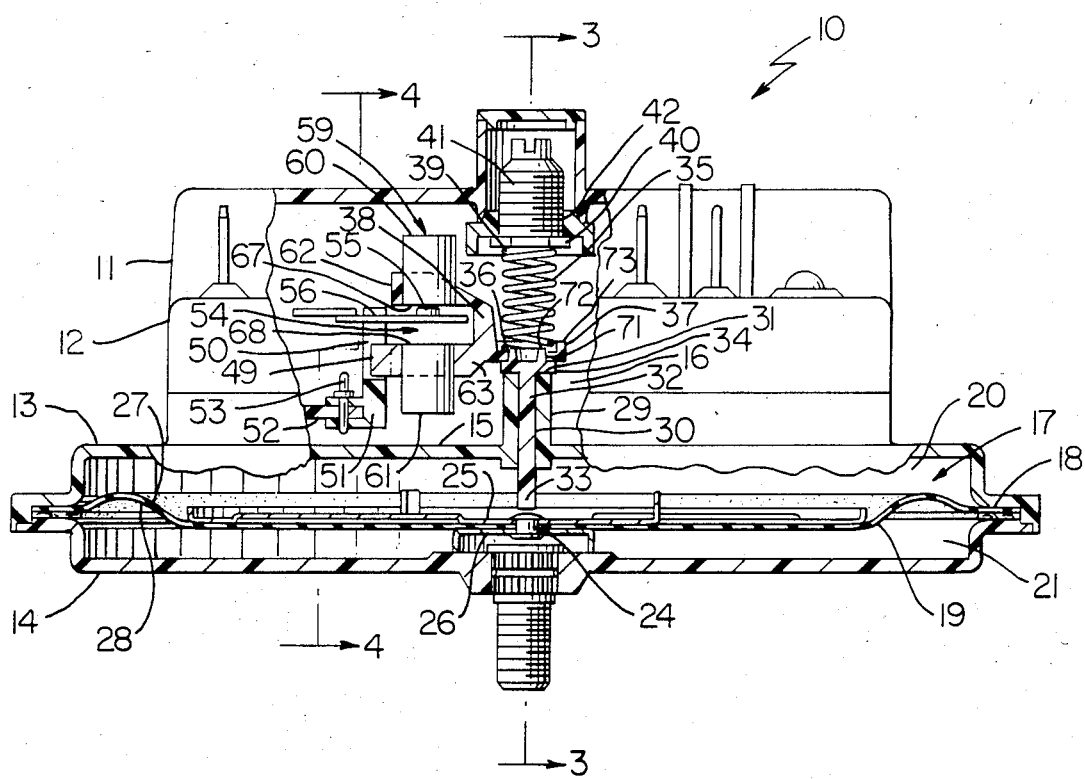
FIG. 2 is an enlarged partially broken away cross-sectional view taken on line 2—2 of FIG. 1.

The actuating pin 32 has an enlarged circular disc-like end 34 adapted to abut against the free end 31 of the tubular part 29 in the manner illustrated in FIG. 2 to limit downward movement of the actuating pin 32 relative to the housing means 11 whereby the moveable part 24 of the flexible diaphragm 19 can move further downwardly relative to the free end 33 of the actuating pin 32 as illustrated in FIG. 2 if desired.

Upward movement of the actuating pin 31 from the position illustrated in FIG. 2 is opposed by the adjustable compression force of a range spring 35 which has one end 36 disposed about and against a spring retainer portion or end 37 of an arm 38 that is disposed against the end 34 of the actuating pin 32 in a manner hereinafter set forth.

Figure 3:
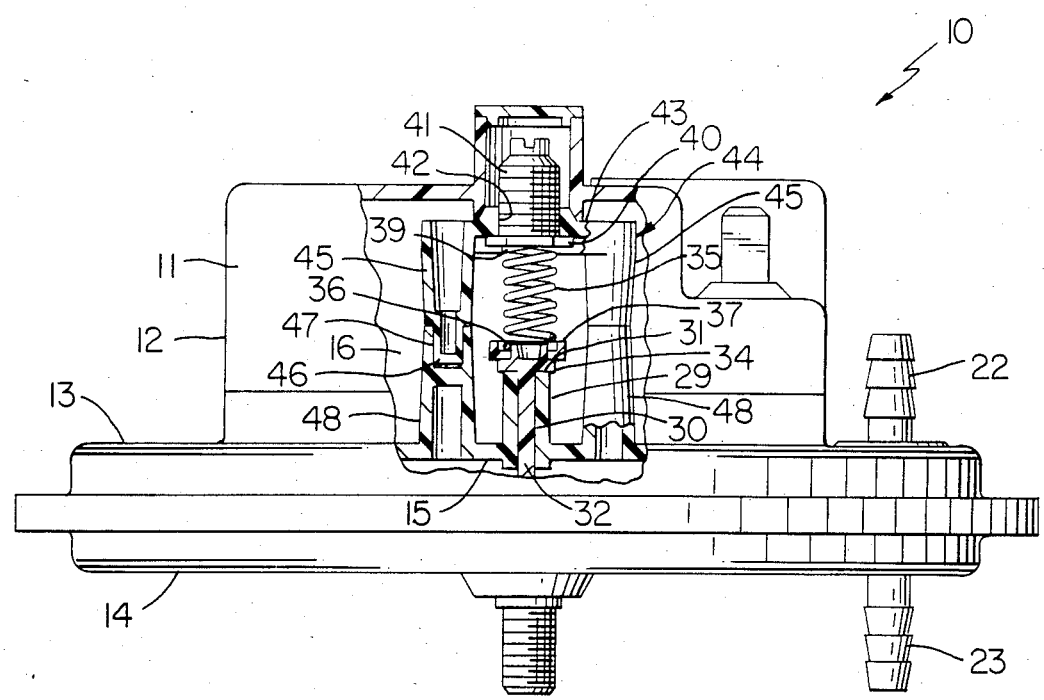
FIG. 3 is a partially broken away cross-sectional view taken away on line 3—3 of FIG. 2.

The other end 39 of the range spring 35 is fastened to a plate 40 carried by a threaded adjusting member 41 threaded into a self-threading opening 42 of a cross member 43 of a U-shaped bridge member 44 that has a pair of legs 45 straddling the range spring 35 in the manner illustrated in FIGS. 3 and 4 and provided with free ends 46 which are received and secured in openings 47 formed in tubular members 48 that extend upwardly from and are formed integrally with the intermediate wall means 15 of the housing part 13 for a purpose hereinafter described.

In this manner, rotation of the adjusting member 41 causes the adjusting member 41 to thread in or out of the opening 42 of the cross member 43 of the U-shaped bridge member 44 in a self-locking manner with the opening 42 and thereby adjust the force of the compression spring 35 acting downwardly on the actuating pin 32, rotation of the range spring 35 during the rotation of adjusting member 41 causing the end 36 of the spring 35 to merely rotate on the spring retainer part or end 37 of the arm 38 as neither the arm 38 nor the actuating pin 32 will rotate therewith.

In particular, the opening means 30 of the tubular part 29 of the intermediate wall 15 is provided with a substantially D-shaped cross-sectional configuration that mates with a like D-shaped cross-sectional configuration of the actuating pin 32 so that the actuating pin 32 will not rotate in the opening 30 but can move axially therein.

Rotation of the arm 38 is prevented by an orienting tang 49 of the arm 38 that is disposed in an orienting slot 50 of a bracket means 51 that is fixed to a wall 52 of the housing means 11 by fastening means 53 as illustrated in the drawings.

A Hall effect transducer means that is generally indicated by the reference numeral 54 is disposed in the actuating chamber 16 of the housing means 11 and comprises a sensor member 55 mounted on a circuit board means 56 in a manner well known in the art of making Hall effect transducer means, such as is set forth in the aforementioned Herden U.S. Pat. Nos. 4,254,395 and 4,340,877 and the Honeywell Microswitch Division Publication No. 84-05704-A 980 whereby these two patents and this publication are being incorporated into this disclosure by this reference thereto.

Figure 5:
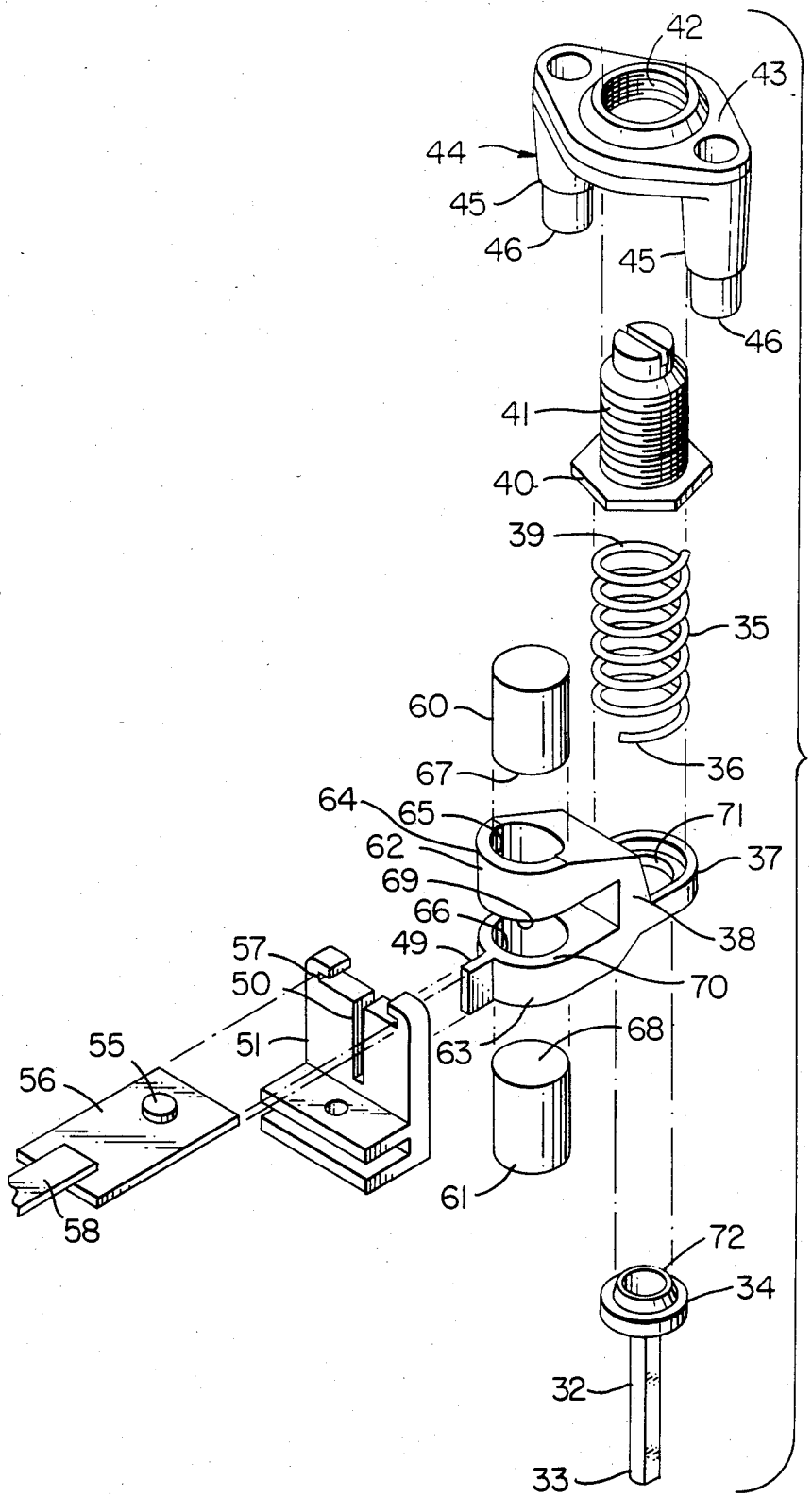
FIG. 5 is an enlarged exploded perpsective view of certain parts of the control device of FIGS. 1-4.

The bracket 51 has a transverse slot means 57 formed therein which receives the circuit board means 56 of the Hall effect transducer means 54 in the manner illustrated in FIGS. 4 and 5 whereby the circuit board means 56 is fixed in the housing means 11 and has suitable terminal means 58 for interconnecting the transducer means 54 into the desired electrical circuit (not shown) in a manner well known in the art for utilizing the signal means being sent by the transducer means 54 as will be apparent hereinafter.

The arm 38 of the control device 10 carries magnet means that is generally indicated by the reference numeral 59 in the drawings and comprises a pair of permanent magnets 60 and 61 that are formed in substantially cylindrical shape and are respectively carried by parts 62 and 63 of the arm 38 that define a bifurcated end 64 of the arm 38.

The parts or portions 62 and 63 of the arm 38 respectively have coaxially aligned substantially cylindrical openings 65 and 66 formed therethrough and respectively receiving the magnets 60 and 61 therein with the magnets 60 and 61 either being press-fitted in the openings 65 and 66 or being secured therein in any suitable manner, such as with adhesive means or the like, so that the magnets respectively have the facing flat surfaces 67 and 68 thereof disposed substantially flush with the facing flat surfaces 69 and 70 of the portions 62 and 63 of the arm 38.

The openings 65 and 66 in the portions 62 and 63 of the arm 38 are so formed that the same position the magnets 60 and 61 that their axes are coaxially aligned not only with each other, but also with the axis of the sensor 55 of the Hall effect transducer means 54 whereby movement of the magnets 60 and 61 relative to the sensor 55 causes the Hall effect transducer means 54 to transmit a signal in relation to the position of the magnets 60 and 61 relative to the sensor 55 in a manner well known in the art for Hall effect transducer means.

The end 37 of the arm 38 has a cylindrical opening means 71 passing therethrough to receive a cylindrical projection 72 on the end 34 of the actuating pin 32 so that the projection 72 that extends beyond the opening 71 of the end 37 of the arm 38 cooperates with an annular flange-like portion 73 of the arm 38 to define a spring retaining means for the end 36 of the compression spring 35 as illustrated in FIG. 2.

The arm 38 can be formed of any suitable material and is illustrated as being formed of plastic material. Also, while the arm 38 has been described as having the end 37 thereof merely being held on the end 34 of the actuator pin 32 by the spring 35, it is to be understood that the end 37 of the arm 38 could be secured to the pin 32, if desired.

While the Hall effect transducer means 54 of this invention can be utilized to control any desired circuit means upon having the magnet means 59 moved relative thereto by the diaphragm 19 in a manner hereinafter set forth, the control device 10 of this invention can be utilized to operate the electrical structure for controlling the defrost cycle of a heat pump system or the like in a manner similar to the control device set forth in the aforementioned Everett U.S. Pat. No. 4,289,963 whereby this U.S. patent is being incorporated into this disclosure by this reference thereto not only for a discussion as to the operation thereof, but also for a further disclosure of the various parts thereof that are similar to parts of the control device 10 of this invention.

For example, during the making of the control device 10 according to the method of this invention, the U-shaped bridge member 44 is secured in place and adjusted in the manner set forth in the aforementioned Everett U.S. Pat. No. 4,289,963.

Therefore, it can be seen that the control device 10 of this invention can be formed from a relatively few parts in a simple manner by the method of this invention to operate in a manner now to be described.

With the control device 10 having the nipples 22 and 23 thereof respectively interconnected to the desired pressure sources and with the Hall effect transducer means 54 being electrically interconnected to the desired electrically operated mechanism so that the electrically operated mechanism will be operated in relation to the magnitude of the substantially linear output of the Hall effect transducer means 54 in a manner well known in the art, it can be seen that as long as the pressure differential acting across the flexible diaphragm 19 is such that the force of the compression spring 35 maintains the enlarged head of the actuating pin 32 against the free end 31 of the tubular member 29 of the intermediate wall 15, the magnet means 59 are in the position illustrated in FIG. 2 and the Hall effect transducer means 54 transmits its signal indicating such position of the magnet means 59.

However, when the pressure differential acting across the diaphragm 19 is sufficient to cause the diaphragm 19 to move upwardly in opposition to the force of the compression spring 35 by the part 24 of the diaphragm 19 acting against the end 33 of the actuator pin 32 to move the same upwardly in FIG. 2, the magnet means 59 will move upwardly in unison therewith so as to position the magnets 60 and 61 in a new position relative to the sensor 55 of the Hall effect transducer means 54 to produce a signal therefrom of a magnitude that is in relation to the new position of the magnet 59 and, thus, the new position of the diaphragm 19 in a manner well known in the art.

Therefore, it can be seen that the control device 10 will produce an output signal from the Hall effect transducer means 54 which will be in relation to the position of the diaphragm 19 relative to the housing means 11 and, thus, in relation to the position of the actuating pin 32 relative to the housing means 11.

Accordingly, it can be seen that this invention not only provides an improved control device of the pressure differential type, but also this invention provides an improved method of making such a control device or the like.

While the form and method of this invention now preferred have been illustrated and described as required by the Patent Statute, it is to be understood that other forms and method steps can be utilized and still fall within the scope of the appended claims.

What is claimed is:

1. In a method of making a control device having a housing means provided with an actuator chamber separated from a pressure differential chamber by wall means having opening means therethrough receiving an axially movable actuator pin that transmits axial movement of a movable part in said pressure differential chamber to said actuator chamber and provided with an adjustable range spring disposed in said actuator chamber and being operatively interconnected to said actuator pin to tend to move said actuator pin in one direction relative to said housing means, the improvement comprising the steps of disposing a Hall effect transducer means in said actuator chamber, forming said actuator pin to have magnet means for operating said transducer means as said movable part axially moves said actuator pin relative to said housing means, disposing said magnet means to be in offset relation to the axis of said actuator pin and so as to move in unison therewith relative to said transducer means, forming said magnet means to comprise an arm having opposed ends and a magnet carried by one of said opposed ends, operatively interconnecting the other of said opposed ends of said arm to said actuator pin, forming said actuator pin to have opposed ends, operatively interconnecting said other end of said arm to one of said opposed ends of said actuator pin by forming said other end of said arm to have an opening therethrough and forming said one end of said actuator pin to have a projection extending through said opening in said other end of said arm, forming said spring to comprise a coiled compression spring and have opposed ends, and bearing one of said opposed ends of said spring against said other end of said arm to hold said other end of said arm against said one end of said actuator pin whereby said magnet moves in unison with said actuator pin, said step of bearing said one end of said spring against said other end of said arm also causing said projection of said actuator pin to be received in said one end of said spring whereby said projection acts as a spring retainer for said one end of said spring.

2. A method of making a control device as set forth in claim 1 and including the steps of forming said other end of said arm to have an opening therethrough, and forming said one end of said actuator pin to have a projection extending through said opening in said other end of said arm.

3. A method of making a control device as set forth in claim 1 and including the steps of forming said one end of said arm to be bifurcated and thereby define two spaced apart portions, causing said magnet to be carried by one of said two portions, forming said magnet means to comprise an other magnet carried by the other of said two portions, and disposing said transducer means between said portions.

4. A method of making a control device as set forth in claim 1 and including the step of coaxially aligning said magnets along an axis that is substantially parallel to the axis of said actuator pin.

5. A method of making a control device as set forth in claim 1 and including the step of forming said portions of said arm to respectively have openings passing therethough that respectively receive said magnets therein.

6. A method of making a control device as set forth in claim 1 and further comprising the steps of forming said other end of said arm to have an annular flange means surrounding said opening thereof and being spaced therefrom, and disposing said one end of said spring to be inboard of said annular flange means whereby said annular flange means cooperates with said projection of said actuator pin to act as a spring retainer for said one end of said spring.

7. A method of making a control device as set forth in claim 1 and further comprising the steps of forming said opening through said other end of said arm to be substantially circular, and forming said projection of said arm to have a substantially cylindrical part disposed in said opening of said other end of said arm whereby said arm is rotationally movable on said actuator pin.

\* \* \* \* \*